United States Patent
Yan

(10) Patent No.: US 7,671,644 B2
(45) Date of Patent: Mar. 2, 2010

(54) PROCESS INSENSITIVE DELAY LINE

(75) Inventor: Hai Yan, Fontana, CA (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 11/439,178

(22) Filed: May 24, 2006

(65) Prior Publication Data
US 2007/0273421 A1    Nov. 29, 2007

(51) Int. Cl.
*H03L 7/06* (2006.01)

(52) U.S. Cl. ............... 327/149; 327/271; 327/273; 327/392; 327/393; 327/400; 327/147; 327/150; 327/153; 327/157

(58) Field of Classification Search .......... None
See application file for complete search history.

(56) References Cited

U.S. PATENT DOCUMENTS

| | | | | |
|---|---|---|---|---|
| 4,392,020 | A * | 7/1983 | Iso et al. ........... | 381/7 |
| 4,599,570 | A * | 7/1986 | Cloke ............ | 327/7 |
| 6,040,742 | A * | 3/2000 | Bailey et al. ....... | 331/2 |
| 6,239,634 | B1 * | 5/2001 | McDonagh ........ | 327/158 |
| 6,407,619 | B1 * | 6/2002 | Tanaka ........... | 327/536 |
| 6,614,287 | B1 * | 9/2003 | Gauthier et al. ..... | 327/362 |
| 6,628,154 | B2 * | 9/2003 | Fiscus ............ | 327/158 |
| 7,034,591 | B2 * | 4/2006 | Wang ............. | 327/158 |
| 7,173,460 | B2 * | 2/2007 | Jaussi et al. ........ | 327/149 |
| 2002/0163986 | A1 * | 11/2002 | Harrison .......... | 375/374 |
| 2003/0025539 | A1 * | 2/2003 | Fiscus ............ | 327/158 |
| 2006/0097763 | A1 * | 5/2006 | Schmitt et al. ...... | 327/158 |
| 2007/0080734 | A1 * | 4/2007 | Kim ............. | 327/218 |

OTHER PUBLICATIONS

Gardner, F.M., IEEE Transactions on Communications, vol. COM-28, No. 11, Nov. 1980, pp. 1849-1858.
Baker, R.J., CMOS, Circuit Design, Layout, and Simulation, 2d ed., Chpt. 19, pp. 592-594.
Baker, et al., CMOS, Circuit Design, Layout, and Simulation, Chpt. 19, pp. 381-383, 422.

* cited by examiner

*Primary Examiner*—Tuan Lam
*Assistant Examiner*—Hiep Nguyen
(74) *Attorney, Agent, or Firm*—Dickstein Shapiro LLP

(57) ABSTRACT

A delay line including a phase detector having two inputs and one output. The first input of the phase detector is connected to an input of the delay line. The second input of the phase detector is connected to an output of the delay line. The output of the phase detector is connected to a control circuit which controls current flow at a control node to produce a control voltage at the node. A voltage-controlled delay unit is responsible to the control voltage to control a delay applied to a signal at an input of the delay line.

22 Claims, 6 Drawing Sheets

PROCESS INSENSITIVE DELAY LINE

FIELD OF THE INVENTION

The invention relates to a process-insensitive delay line used to accommodate inherent differences in devices due to fabrication inconsistencies.

BACKGROUND OF THE INVENTION

Delay lines are typically incorporated into electronic devices to accommodate inherent differences in electronic components due to fabrication imperfections. A conventional delay line typically utilizes the input to output delay of one or more inverters arranged in series to accommodate the inherent differences of electronic components. The number and type of inverters used is determined by the required delay time. However, the overall delay time resulting from the one or more serial inverters is subject to process and/or environmental variations such as process corners (i.e., process variations arising during fabrication), changes in temperature during operation and power supply fluctuations. When variations in the process and environmental factors are aggregated together, the resulting delay time may vary from the expected delay time by as much as fifty percent. Faced with such inconsistencies, circuit and device designers are forced to over-design their circuits or devices, with respect to the original specifications, to accommodate the resulting overall delays experienced.

For example, in a high-speed pipe line analog-to-digital converter (ADC) with a clock frequency of 25 Megahertz (MHz), the duration of a clock pulse is 20 nanoseconds (nS). Of this 20 nS, 4 nS is typically allocated to the non-overlapping time of the non-overlapping clock (thereby allowing time for the comparator to settle), 2 nS is typically allocated to a slew-rate limiting period of the operational amplifier (opamp) settling time, 1 nS is typically allocated to the bottom-plate sampling edge, leaving only 12 nS for a bandwidth limiting period of the opamp settling time. If a conventional delay line is used to control the 4 nS non-overlapping time of the non-overlapping clock, the actual delay time can vary between approximately 2.5 nS to 6 nS. In this case the designer would be forced to over design the comparator to ensure that the comparator is capable of settling within 2.5 nS in the worst case, and would have to over design the opamp to ensure that the opamp can settle within 10 nS (rather than the 12 nS) in light of the uncertainty of the non-overlapping time.

As a second example, FIG. 1 depicts a pixel-array readout scheme 100 that is well understood by one of ordinary skill in the art. For example, and without limitation, the pixel-array readout scheme of FIG. 1 includes one hundred columns 105. The pixel array is read out row-by-row. Each time a row is read, the voltage values from the pixel array are stored in capacitors 110 located in sampling columns. In order to read the voltage values stored in the sampling columns, the sampling columns (cs) are connected to the readout circuitry column by column through column select switches 115. The column select switches 115 are controlled by the column address. The charges stored in the capacitors 110 are then "crow-bared" out to the readout circuitry through crow-bar (cb) switches 120.

FIG. 2 illustrates a desired timing relationship between the sampling columns (cs) and the crow-bar (cb) switches. The time t1 is typically used to reset the first stage of the readout circuitry. The time t2 is reserves as a time margin to ensure the current crow-bar is completed prior to any column address change. Typically, cs1-cs100 and cb1-cb100 are derived from a column address and a crow-bar clock. In this case, the falling edge of cb is typically, for example, several nanoseconds ahead of the falling edge of cs. The falling edge of cs is controlled by a delay line in a clock generation block. In light of power supply voltage variations, process variations and environmental temperature variations, a design margin must be include to ensure cb falls before the column address changes. However, including this design margin reduces the available time for t1 resulting in a reduced reset time for the first stage of the readout circuitry. This reduced reset time may manifest itself in column-wise fixed pattern noise.

A need exists to reduce or eliminate uncertainties in delay times caused by process and environmental variations. A further need exists to accurately predict the resulting delay times for circuits or devices added to overcome inherent differences due to device fabrication.

DETAILED DESCRIPTION OF THE INVENTION

In a desired embodiment, a process-insensitive delay line is continuously adjustable and is used to reduce or eliminate delay time uncertainties due to process and/or environmental variations. In the desired embodiment, the delay time of the process-insensitive delay line is controlled by the ratio of a charging current ($I_{charge}$) and a control current ($I_{control}$). The charging current and the control current typically come from a digitally controlled current source (IDAC), in which the control current is adjustable by a multi-bit digital code. For example, and without limitations, the process-insensitive delay line may be used in a CMOS imager to improve performance with a sample and hold circuit having a continuously-adjustable accurate crow-bar delay control to reduce column-wise fixed noise pattern (FPN), and to improve a continuously-adjustable accurate non-overlapping time control for an analog to digital converter (ADC).

Figure 1:
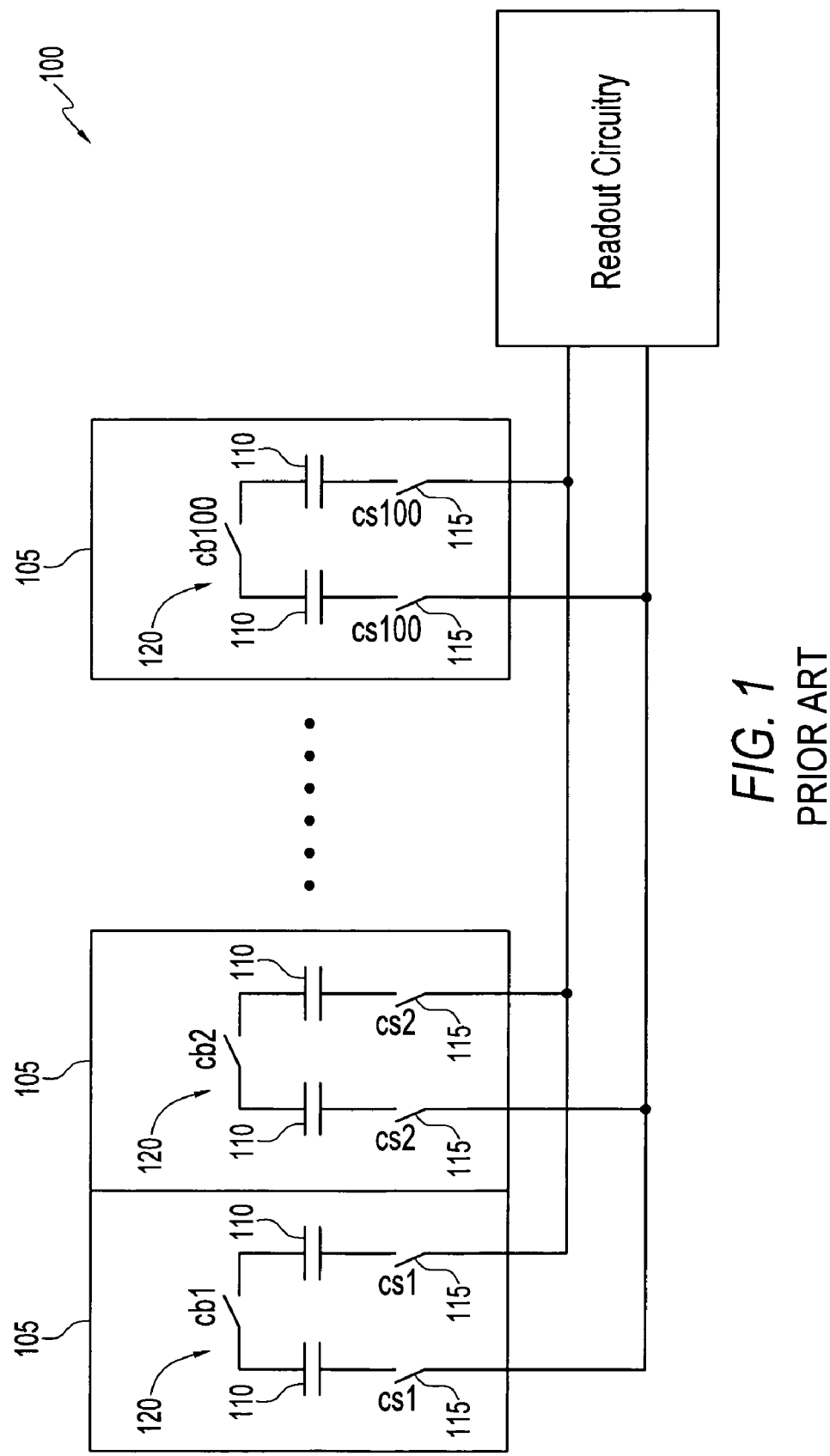
FIG. 1 depicts a pixel-array readout scheme.
Figure 2:
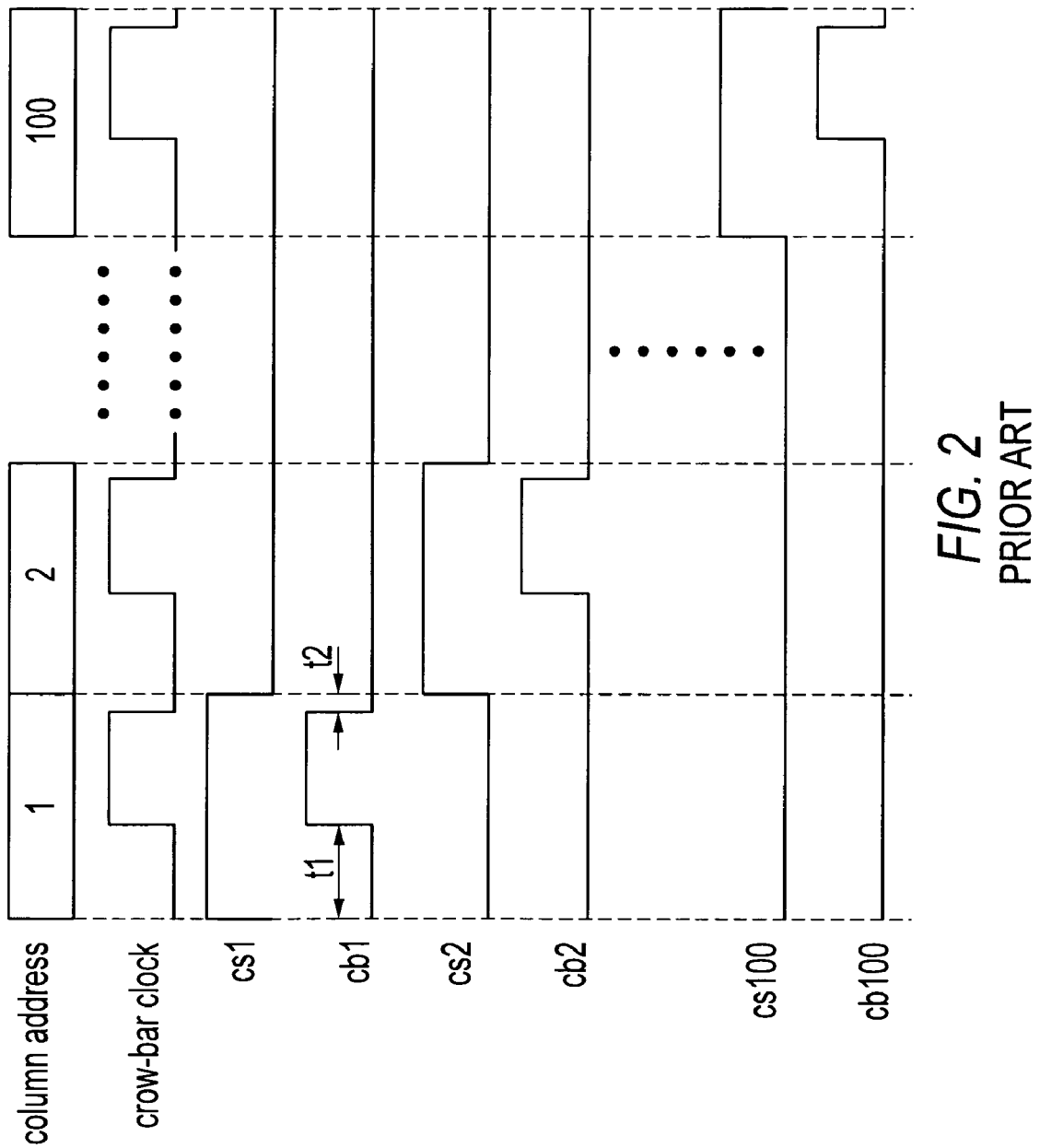
FIG. 2 illustrates a timing relationship between the sampling columns and the crow-bar switches of FIG. 1.
Figure 3:
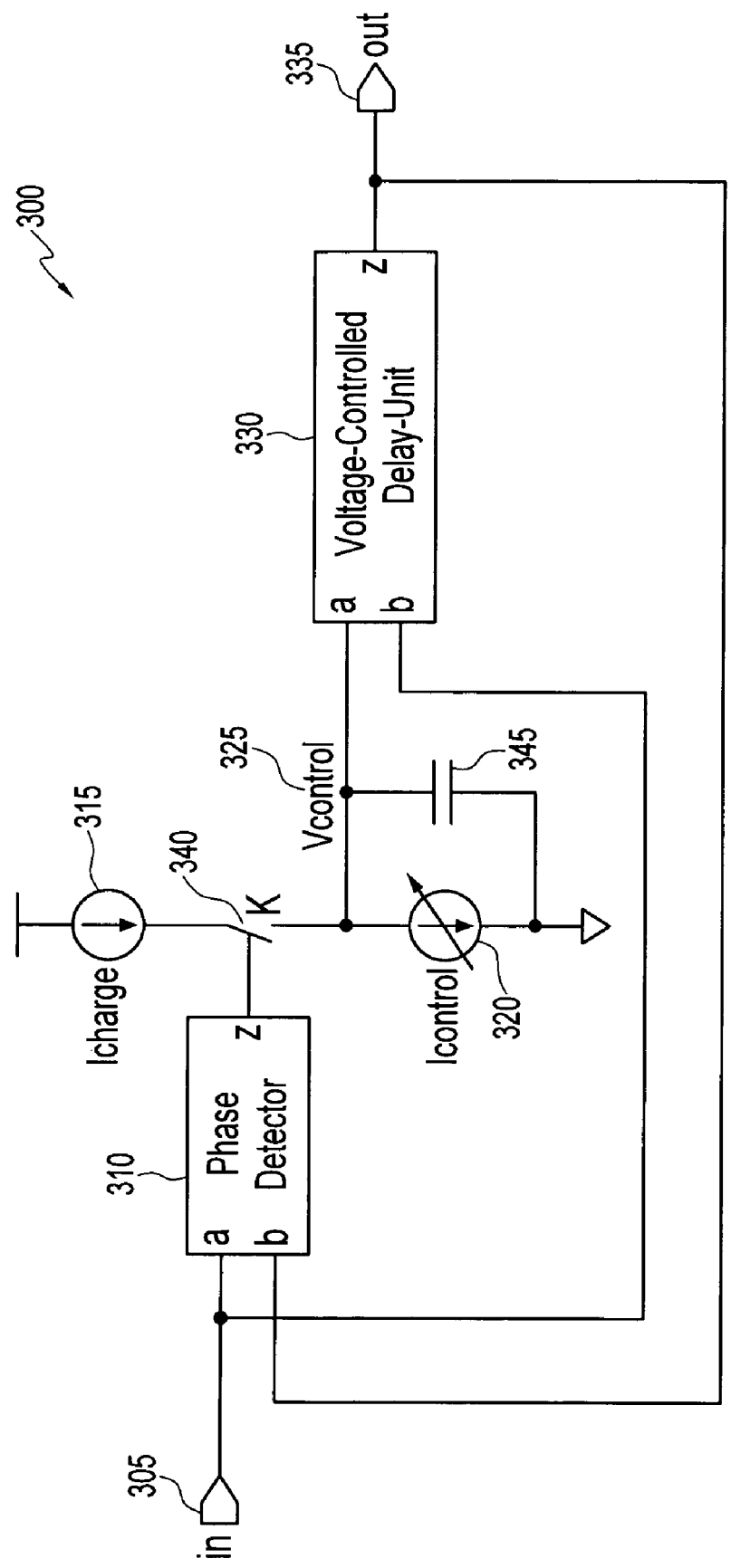
FIG. 3 depicts a block diagram of a desired embodiment of a process-insensitive delay line.

FIG. 3 depicts a block diagram of a desired embodiment of a process-insensitive delay line 300. Process-insensitive delay line 300 includes an input signal terminal 305, a phase detector 310, a charge current ($I_{charge}$) source 315, a control current source ($I_{control}$) 320, a voltage-control node ($V_{control}$) 325, a voltage-controlled delay-unit 330, a two position switch 340, a capacitor 345, and an output terminal 335. The output from output terminal 335 of the voltage-controlled delay-unit 330 is a delayed version of the signal received at the input terminal 305. The delay time resulting from FIG. 3 is controlled by the voltage level at voltage-control node 325. As the voltage level at voltage-control node 325 increases, the resulting delay time decreases.

The phase detector 310 compares the phase difference between the input signal IN and the output signal OUT and produces a pulse (K) that corresponds to the time difference of the rising edges of the input IN and output OUT signals. The pulse produced by phase detector 310 is used to configure the two position switch 340 such that the charge current source 315 is connected to the voltage-control node 325. When no delay is required, phase detector 310 does not pulse the two position switch 340 and the charge current source 315 is not connected to the voltage-control node 325. However, during a desired delay period of the output of the process-insensitive delay line 300, phase detector 310 pulses two position switch 340 such that charge current source 315 is connected to voltage-control node 325. In this configuration, charge current source 315 attempts to increase the charge on voltage-control node 325. Simultaneously, control current source 320 extracts charges from voltage-control node 325 during the entire clock cycle. At equilibrium, there is no net charge being received by voltage-control node 325 and there is no net charge being dissipated from voltage-control node 325. At equilibrium the following equation is satisfied: $I_{charge}*t_{delay}=I_{control}*t_{clk}$ where $I_{charge}$ is the charge added during 1 clock period from charge current source 315, $I_{control}$ is the charge dissipated during one clock period, $t_{delay}$ is the delay time and $t_{clk}$ is the clock time in nanoseconds (clock pulse). Rearranging the equation results in: $t_{delay}=(I_{control}/I_{charge})*t_{clk}$, while the absolute values of both $I_{charge}$ and $I_{control}$ are affected by process and/or environmental variations, since both $I_{charge}$ and $I_{control}$ come from the same IDAC, the ratio of $I_{control}/I_{charge}$ remains unaffected by process and/or environmental variations. Based on the design of the IDAC, the ratio $I_{control}/I_{charge}$ is controlled by a multi-bit digital code.

For example, and without limitation, in one of the possible IDAC designs, the charging current source 315 is designed to be 16 microamps (μA), while the control current source 320 is adjustable through a 6-bit digital code between 0 μA and 16 μA linearly. For example, if a digital code of 000100 (binary) is selected, then the control current source 320 is 1.016 μA. Assuming a clock frequency of 25 MHz, the corresponding delay time is expected to be:

$$t_{delay}=(I_{control}/I_{charge})*t_{clk}$$

$$t_{delay}=1.016 \text{ μA}/16 \text{ μA}*40 \text{ nS}$$

$$t_{delay}=0.0635*40 \text{ nS}=2.54 \text{ nS}$$

When process and/or environmental variations occur, the absolute values of both $I_{control}$ and $I_{charge}$ change, but the ratio of the two currents is only determined by the multi-bit digital code and remains at 0.0635, which ensures the delay time is still 2.54 nS. Similarly, a digital code of 001000 would result in a $t_{delay}$ of 5.08 nS and a digital code of 010000 would result in a $t_{delay}$ of 10.16 nS.

In a desired embodiment, voltage-controlled delay unit 330 has two inputs; one of which is connected to the voltage-control node 325 and the second of which is connected to receive the input signal IN. When a delay is required, the input connected to the voltage-control node 325 is determined by the net effect of integration of the charge current source 315 and the control current source 320 on the capacitor 345.

Figure 4:
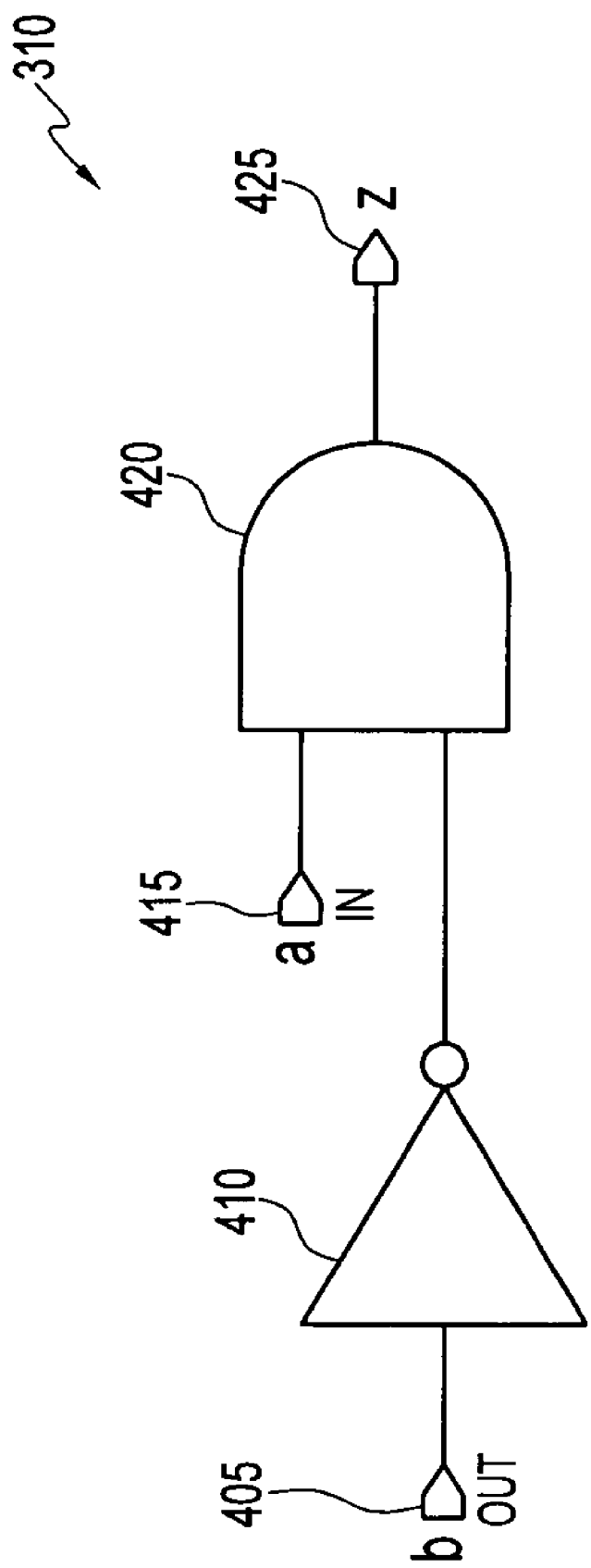
FIG. 4 depicts an exemplary design of the phase detector 110 of FIG. 3.

FIG. 4 depicts one exemplary phase detector which may be used as phase detector 310 of FIG. 3. The illustrated embodiment of the phased detector 310 of FIG. 4 includes two input terminals 405 and 415, an inverter 410, a NAND gate 420 and an output terminal 425. The phased detector 310 compares the phase difference between the input (received at terminal 415) and the output signal (received at terminal 405), and outputs a pulse, at output terminal 425, that corresponds to the time difference of the rising edges of the received input and output signals.

Figure 5:
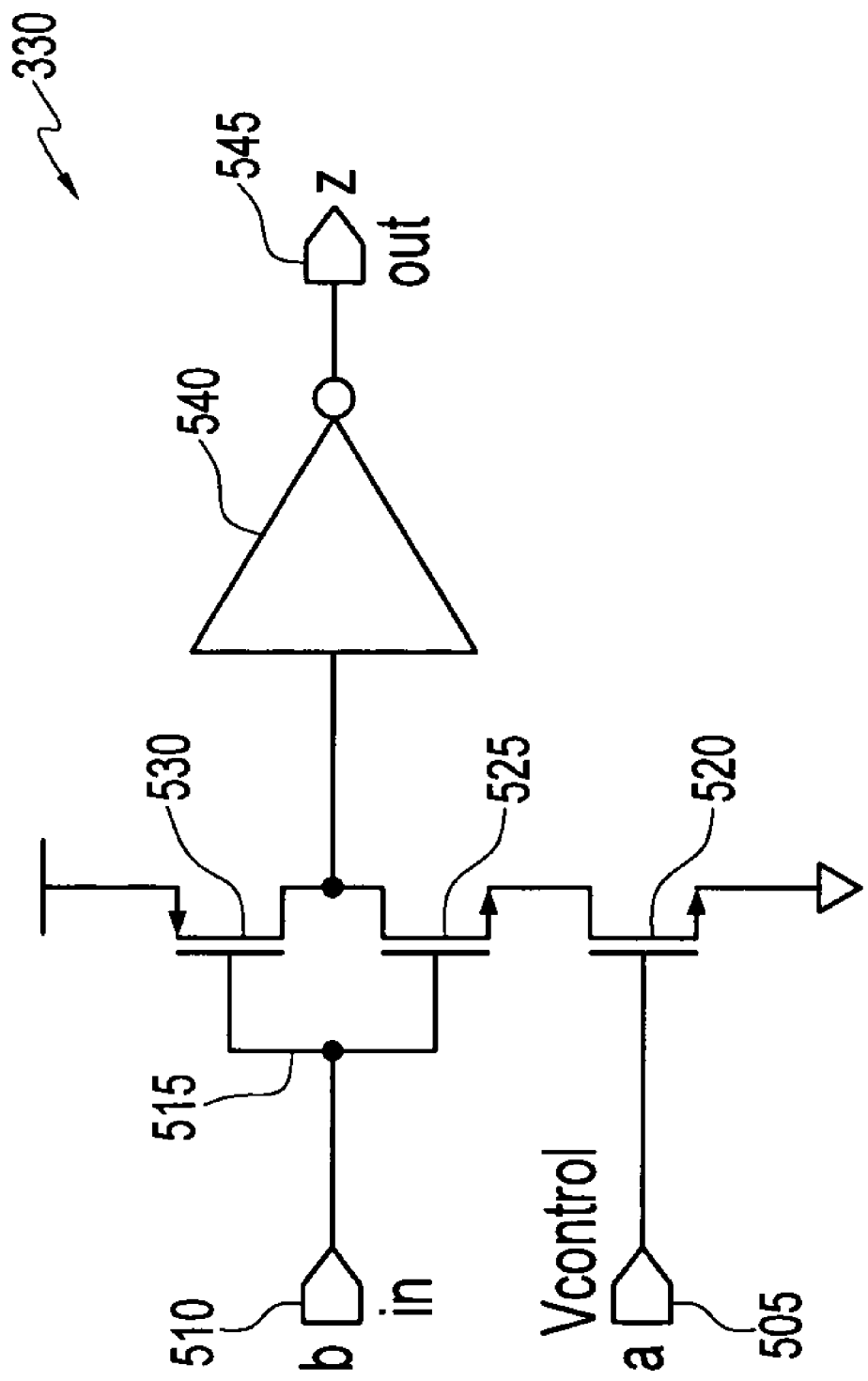
FIG. 5 depicts an exemplary design of the voltage-controlled delay-unit 130 of FIG. 3.

FIG. 5 depicts one exemplary voltage-controlled delay-unit which may be used as delay-unit 330 of FIG. 3. In the illustrated embodiment, the voltage-controlled delay-unit 330 includes two input terminals 505 and 510, a node 515, three transistors 520, 525 and 530, an inverter 540 and an output terminal 545. The voltage-controlled delay unit 330 receives $V_{control}$ at terminal 505, input at terminal 510 and produces an output signal at terminal 545.

The process-insensitive delay line 300 may be utilized within many applications such as in a CMOS imager as described above and in other applications such as DRAM applications, and may also be characterized as an analog delay lock loop, or a charge pump.

Figure 6:
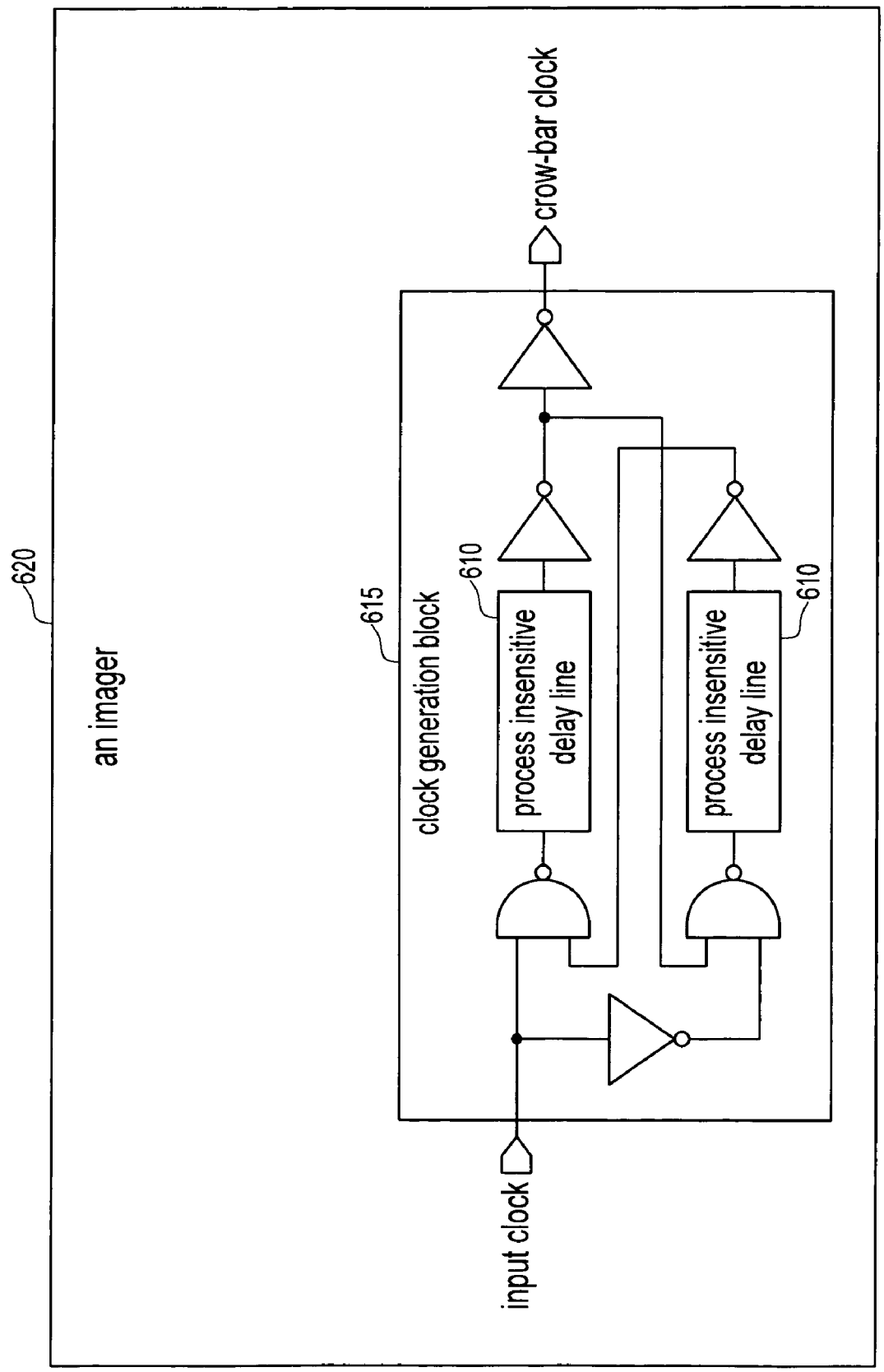
FIG. 6 illustrates an application of the controllable delay line in the clock generation block of an imager.

FIG. 6 illustrates the use of the controllable delay line 610 in the clock generation block 615 of an imager 620. As illustrated, when the controllable delay line 610 is used in the generation block 615 the imager 620 can better tolerate power supply voltage variations, process variations, and environmental temperature variations. As described, the falling edge of the crow-bar can be more accurately controlled, allowing more time to reset the first stage of the readout circuitry to potentially improve the performance of the readout circuitry.

What is claimed as new and desired to be protected by Letters Patent of the United States is:

1. A delay line comprising:
   a phase detector having two inputs and a single output, said first input of said phase detector connected to an input of said delay line, said second input of said phase detector connected to an output of said delay line, said output of said phase detector connected to a switch;
   a charge current source directly connected to a first terminal of said switch, a second terminal of said switch being directly connected to a voltage control node, such that said charge current source is selectively connected to a voltage-control node through said switch in response to the output of said phase detector to supply current to said voltage-control node;
   a control current source connected to said voltage-control node and to said second terminal of said switch constantly for withdrawing current from said voltage control node;
   a capacitor located in parallel with said control current source; and
   a voltage-controlled delay unit having two inputs and one output, said first input of said voltage-controlled delay unit connected to said voltage-control node, said second input of said voltage-controlled delay unit connected to said input of said delay line, and said output of said voltage-controlled delay unit being the output of said delay line.

2. The delay line of claim 1 wherein said phase detector is used to control said switch such that said charge current source is connected to said voltage control node during a delay period.

3. The delay line of claim 1 wherein said first input of said voltage-controlled delay unit is determined by the net effect on said capacitor of an integration of charge current of the charge current source and control current of the control current source.

4. The delay line of claim 1 wherein said phase detector compares a phase of said first input from said delay line and a phase of said second input from said output of said delay line and uses said comparison to switch said switch such that said charge current source is connected to said voltage-control node during a delay period.

5. The delay line of claim 1 wherein said phase detector comprises an inverter and a NAND gate.

6. The delay line of claim 1 wherein said voltage-controlled delay unit comprises three transistors and an inverter, wherein the first input of the voltage-controlled delay unit is connected to gates of two of the three transistors and the second input of the voltage-controlled delay unit is connected to a gate of the third of the three transistors, and wherein the inverter is connected between the two of the three transistors connected to the first input.

7. The delay line of claim 1 wherein said delay line is a process-insensitive delay line.

8. A delay line comprising:
   a phase detector having two inputs and a single output, said first input of said phase detector connected to an input of said delay line, and said second input of said phase detector connected to an output of said delay line;
   a charge current source switchably connected to a voltage-control node for supplying a charge to said node through a switch directly connected between the charge current source and voltage-control node and controlled by the output of the phase detector to connect said charge current source to said voltage-control node when said input signal is to be delayed;
   a control current source constantly connected to said voltage-control node for draining charge from said node;
   a capacitor connected to said voltage control node for storing charge;
   a voltage-controlled delay unit having two inputs and one output, said first input of said voltage-controlled delay unit connected to said voltage-control node, said second input of said voltage-controlled delay unit connected to said input of said delay line, and said output of said voltage-controlled delay unit being the output of said delay line.

9. The delay line of claim 8 wherein control of the switch is dependent on a comparison performed in said phase detector between said two inputs.

10. A delay line comprising:
    a phase detector for receiving an input signal and an output signal and outputting single conductor pulses based on the differences between said input signal and said output signal;
    a control circuit responsive to said single conductor pulses, for controlling current flow from a charge current source to a control node, the charge current source and control node being connected by a switch, a control current source constantly connected to said control node, to produce a control voltage at said node based on pulses received from said phase detector; and
    a delay unit for outputting a delayed input signal as the output signal based on said control voltage.

11. A method of delaying a signal, said method comprising the steps of:
    providing said signal to a first input of a phase detector and to a first input of a voltage-controlled delay unit;
    providing an output of said voltage-controlled delay unit to a second input of said phase detector;
    electrically connecting a voltage-control node to a second input of said voltage-controlled delay unit wherein a voltage of said voltage-control node is controlled by a capacitor connected in parallel with a control current source;
    driving a position of a switch with a single output of said phase detector; such that said switch directly connects a charge current source to a voltage-control node when a delay of the signal is desired; and
    a control current source constantly connected to said voltage-control node.

12. The method of claim 11 wherein a voltage on said capacitor is determined by the net effect on said capacitor of an integration of charge current of the charge current source and control current of the control current source.

13. An imager including a clock generation block, said clock generation block comprising:
    a clock input,
    a crow-bar clock output;
    at least one delay line wherein said delay line includes a phase detector having two inputs and a single output, said first input of said phase detector connected to an input of said delay line, said second input of said phase detector connected to an output of said delay line, said output of said phase detector connected to a switch;
    a charge current source directly connected to one terminal of said switch;
    a control current source constantly connected to a voltage-control node, the voltage-control node being directly connected to a second terminal of said switch;
    a capacitor located in parallel with said control current source; and
    a voltage-controlled delay unit having two inputs and one output, said first input of said voltage-controlled delay unit connected to said voltage-control node, said second input of said voltage-controlled delay unit connected to said input of said delay line, and said output of said voltage-controlled delay unit being the output of said delay line.

14. The imager of claim 13, wherein said phase detector is used to control said switch such that said charge current source is connected to said voltage control node during a delay period.

15. The imager of claim 13, wherein said first input of said voltage-controlled delay unit is determined by the net effect on said capacitor of an integration of charge current of the charge current source and control current of the control current source.

16. The imager of claim 13, wherein said phase detector compares a phase of said first input from said delay line and a phase of said second input from said output of said delay line and uses said comparison to switch said switch such that said charge current source is connected to said voltage-control node during a delay period.

17. The imager of claim 13, wherein said phase detector comprises an inverter and a NAND gate.

18. The imager of claim 13, wherein said voltage-controlled delay unit comprises three transistors and an inverter, wherein the first input of the voltage-controlled delay unit is connected to gates of two of the three transistors and the second input of the voltage-controlled delay unit is connected to a gate of the third of the three transistors, and wherein the inverter is connected between the two of the three transistors connected to the first input.

19. The imager of claim 13, wherein said delay line is a process-insensitive delay line.

20. A method of delaying an input clock signal within an imager, said method comprising the steps of:
    providing said input clock signal to a first input of a phase detector and to a first input of a voltage-controlled delay unit;
    providing an output of said voltage-controlled delay unit to a second input of said phase detector;
    electrically connecting a voltage-control node to a second input of said voltage-controlled delay unit wherein a voltage of said voltage-control node is controlled by a capacitor connected in parallel with a control current source;
    driving a position of a switch with a single output of said phase detector; such that said switch directly connects a charge current source to a voltage-control node when a delay of the signal is desired; and constantly connecting a control current source to said voltage control node.

21. A delay line comprising:

a phase detector having two inputs and only a single output, said first input of said phase detector connected to an input of said delay line, said second input of said phase detector connected to an output of said delay line, said single output of said phase detector connected to a switch;

a charge current source directly connected to one terminal of said switch;

a control current source constantly connected to a voltage-control node, the voltage-control node being directly connected to a second terminal of said switch;

a capacitor located in parallel with said control current source; and a voltage-controlled delay unit having two inputs and one output, said first input of said voltage-controlled delay unit connected to said voltage-control node, said second input of said voltage-controlled delay unit connected to said input of said delay line, and said output of said voltage-controlled delay unit being the output of said delay line.

22. A delay line comprising:

a phase detector having two inputs and a single output, said first input of said phase detector connected to an input of said delay line, said second input of said phase detector connected to an output of said delay line, said output of said phase detector connected to a single switch;

a charge current source directly connected to one terminal of said switch;

a control current source constantly connected to a voltage-control node, the voltage-control node being directly connected to a second terminal of said switch;

a capacitor located in parallel with said control current source; and a voltage-controlled delay unit having two inputs and one output, said first input of said voltage-controlled delay unit connected to said voltage-control node, said second input of said voltage-controlled delay unit connected to said input of said delay line, and said output of said voltage-controlled delay unit being the output of said delay line.

\* \* \* \* \*